US012601617B2

(12) United States Patent
Yamamoto et al.

(10) Patent No.: US 12,601,617 B2
(45) Date of Patent: Apr. 14, 2026

(54) COMPOSITE MOLDED COMPONENT

(71) Applicant: Sumitomo Wiring Systems, Ltd., Yokkaichi (JP)

(72) Inventors: Hironobu Yamamoto, Yokkaichi (JP); Yukitoshi Terasaka, Yokkaichi (JP); Kyungwoo Kim, Yokkaichi (JP); Toshinari Kobayashi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 677 days.

(21) Appl. No.: 18/000,495

(22) PCT Filed: May 19, 2021

(86) PCT No.: PCT/JP2021/018907

§ 371 (c)(1),
(2) Date: Dec. 1, 2022

(87) PCT Pub. No.: WO2021/246167

PCT Pub. Date: Dec. 9, 2021

(65) Prior Publication Data

US 2023/0213363 A1 Jul. 6, 2023

(30) Foreign Application Priority Data

Jun. 3, 2020 (JP) ................................. 2020-097063

(51) Int. Cl.
*G01D 11/24* (2006.01)
*G01R 33/07* (2006.01)
(52) U.S. Cl.
CPC ......... *G01D 11/245* (2013.01); *G01R 33/072* (2013.01)

(58) Field of Classification Search
CPC ......... B29C 33/14; B29C 33/42; B29C 45/14; G01D 11/245; G01R 33/0047; G01R 33/02; G01R 33/072
See application file for complete search history.

(56) References Cited

U.S. PATENT DOCUMENTS

| | | | | |
|---|---|---|---|---|
| 4,635,945 A | * | 1/1987 | Beck ...................... | F16J 15/166 277/540 |
| 5,749,656 A | * | 5/1998 | Boehm ................ | H01R 13/405 374/185 |

(Continued)

FOREIGN PATENT DOCUMENTS

| | | |
|---|---|---|
| JP | H11-351989 A | 12/1999 |
| JP | 2004-012415 A | 1/2004 |

OTHER PUBLICATIONS

International Search Report, Application No. PCT/JP2021/018907, mailed Jul. 27, 2021. ISA/Japan Patent Office.

*Primary Examiner* — Yan Lan
(74) *Attorney, Agent, or Firm* — Brooks Kushman PC

(57) ABSTRACT

The object of the present invention is to further improve the performance of a seal between an inner molded portion and an outer molded portion. A composite molded component includes: an internal component; an inner molded portion that covers the internal component; and an outer molded portion that covers the inner molded portion. A hole that reaches the inner molded portion is formed in the outer molded portion. A ring-shaped seal portion that surrounds the hole is provided between the inner molded portion and the outer molded portion. The ring-shaped seal portion is formed of a softer material than the inner molded portion.

16 Claims, 5 Drawing Sheets

(56) References Cited

U.S. PATENT DOCUMENTS

2017/0153265 A1    6/2017  Yamamoto et al.
2020/0208617 A1*  7/2020  Algawi .............. A61M 5/1422

* cited by examiner

COMPOSITE MOLDED COMPONENT

CROSS-REFERENCE TO RELATED APPLICATIONS

This application is the U.S. national stage of PCT/JP2021/018907 filed on May 19, 2021, which claims priority of Japanese Patent Application No. JP 2020-097063 filed on Jun. 3, 2020, the contents of which are incorporated herein.

TECHNICAL FIELD

The present invention relates to a composite molded component.

BACKGROUND

JP 2017-96828A discloses a technology where a molded object is configured by integrating a detection unit, including a detection element portion, and a holder portion using injection molding or the like, and a molded resin portion is then formed on the molded object by injection molding or the like.

There is demand for further improvement in the performance of a seal between an inner molded portion and an outer molded portion.

For this reason, it is an object of the present disclosure to further improve the performance of a seal between an inner molded portion and an outer molded portion.

SUMMARY

A composite molded component according to an aspect of the present disclosure includes: an internal component; an inner molded portion that covers the internal component; and an outer molded portion that covers the inner molded portion, wherein a hole that reaches the inner molded portion is formed in the outer molded portion, a ring-shaped seal portion that surrounds the hole is provided between the inner molded portion and the outer molded portion, and the ring-shaped seal portion is formed of a softer material than the inner molded portion.

Advantageous Effects of Invention

According to the present disclosure, performance of a seal between an inner molded portion and an outer molded portion is further improved.

DETAILED DESCRIPTION OF PREFERRED EMBODIMENTS

Figures 1, 2:
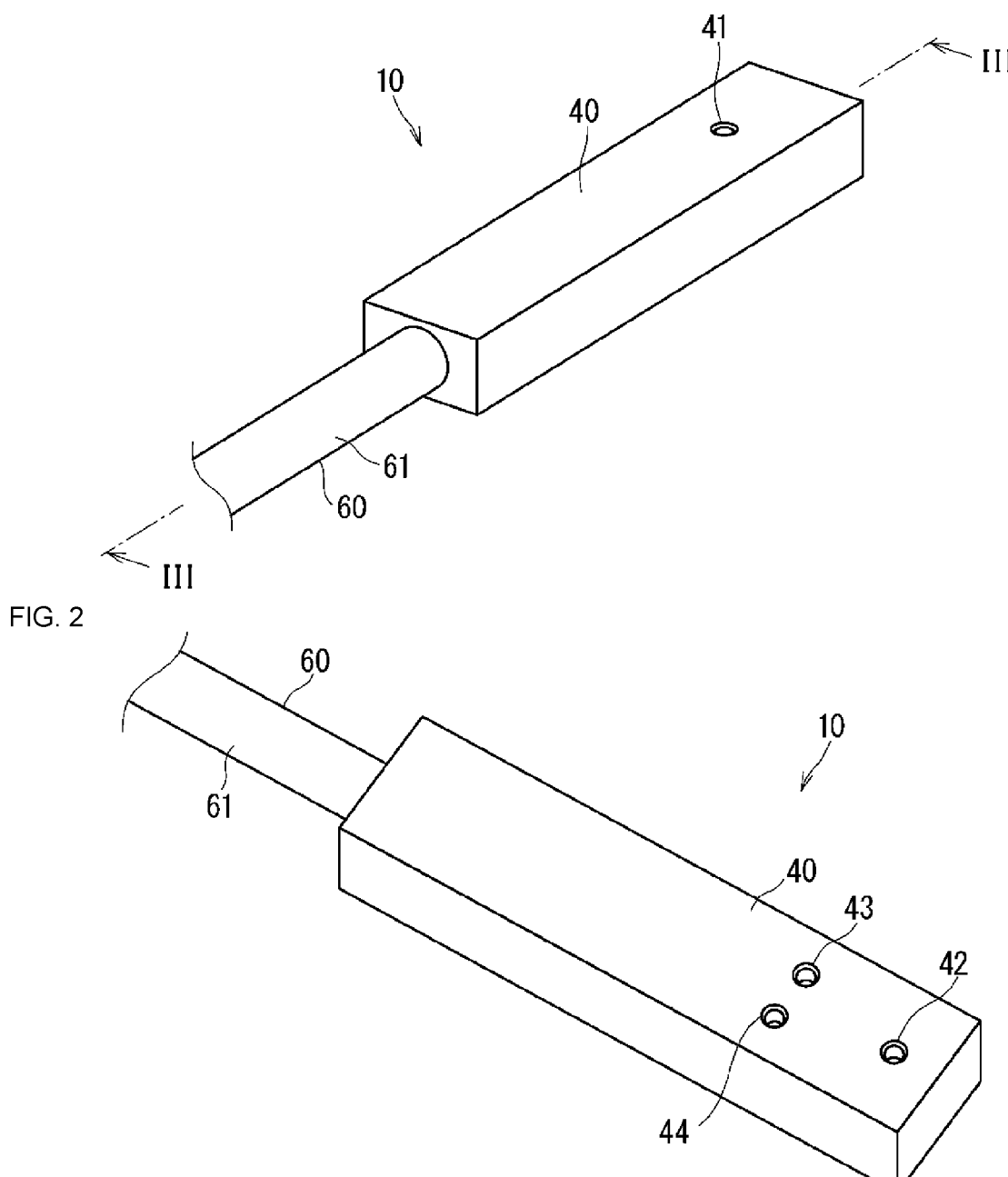
FIG. 1 is a perspective view depicting a composite molded component.
FIG. 2 is a perspective view depicting the composite molded component.

Several embodiments of the present disclosure will first be listed and described in outline.

One aspect of a composite molded component according to the present disclosure is as follows.

First Aspect

In accordance with a first aspect, a composite molded component includes: an internal component; an inner molded portion that covers the internal component; and an outer molded portion that covers the inner molded portion, wherein a hole that reaches the inner molded portion is formed in the outer molded portion, a ring-shaped seal portion that surrounds the hole is provided between the inner molded portion and the outer molded portion, and the ring-shaped seal portion is formed of a softer material than the inner molded portion. According to the present disclosure, even if deformation of at least one of the inner molded portion and the outer molded portion occurs due to thermal shrinkage, thermal expansion, or the like, the ring-shaped seal portion is capable of deforming in keeping with such deformation. By doing so, sealing of a part that surrounds the hole between the inner molded portion and the outer molded portion is maintained by the ring-shaped seal portion. As a result, the performance of the seal between the inner molded portion and the outer molded portion is further improved. Since the ring-shaped seal portion is provided at a part that surrounds the hole and not the entire inner molded portion and outer molded portion, it is possible to maintain the required strength for the composite molded component.

Second Aspect

In a second aspect, the composite molded component according to the first aspect, the inner molded portion and the outer molded portion may be formed of polyamide resin, and the ring-shaped seal portion may be formed of urethane resin. By forming the inner molded portion and the outer molded portion of polyamide resin, the composite molded component can be provided with strength. Also, by forming the ring-shaped seal portion of urethane resin, the performance of the seal around the hole between the inner molded portion and the outer molded portion is improved.

Third Aspect

In a third aspect, the composite molded component according to the first or the second aspect, a ring-shaped channel that surrounds the hole may be formed in a surface of the inner molded portion and the ring-shaped seal portion may be provided to fill the ring-shaped channel. Since the ring-shaped seal portion is provided so as to fill the ring-shaped channel in the surface of the inner molded portion, the ring-shaped seal portion is likely to remain in place surrounding the hole when the outer molded portion is formed.

Fourth Aspect

In a fourth aspect, the composite molded component according to any of the first to the fourth aspects, the inner molded portion and the ring-shaped seal portion may be formed by double molding or insert molding with the inner molded portion as a primary molded portion and the ring-shaped seal portion as a secondary molded portion. Adhesion between the inner molded portion and the ring-shaped seal portion is enhanced, which further improves the seal.

Fifth Aspect

In a fifth aspect, the composite molded component according to any one of the first to the fourth aspects, a plurality of the ring-shaped seal portions may be formed, and a connecting portion formed of a same material as the ring-shaped seal portions may be provided so as to connect the plurality of ring-shaped seal portions. It becomes easy to form the plurality of ring-shaped seal portions in a state where the ring-shaped seal portions are connected by the connecting portion.

Sixth Aspect

In a sixth aspect, the composite molded component according to any one of the first to the fifth aspect, each ring-shaped seal portion may protrude from the inner molded portion. Since the ring-shaped seal portion protrudes from the inner molded portion, it becomes easy to heat the ring-shaped seal portion when the outer molded portion is molded. As a result, it is easy to produce a state where the ring-shaped seal portion tightly adheres to the outer molded portion.

Specific examples of composite molded components according to the present disclosure are described below with reference to the drawings. It should be noted that the present disclosure is not limited to the examples described here, and is instead indicated by the range of the patent claims and is intended to include all modifications within the meaning and scope of the patent claims and their equivalents.

Embodiments

Figure 3:
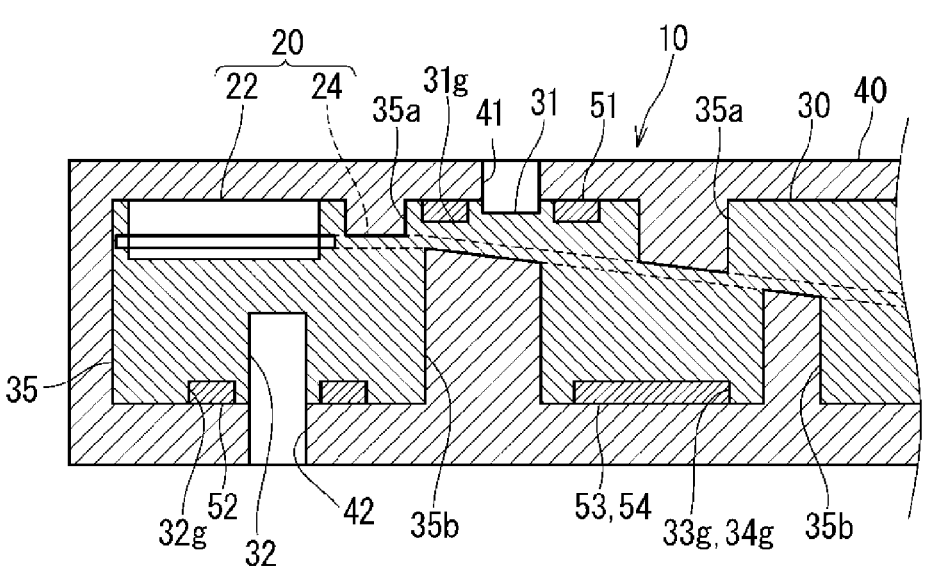
FIG. 3 is a cross-sectional view along a line III-III in FIG. 1.
Figure 4:
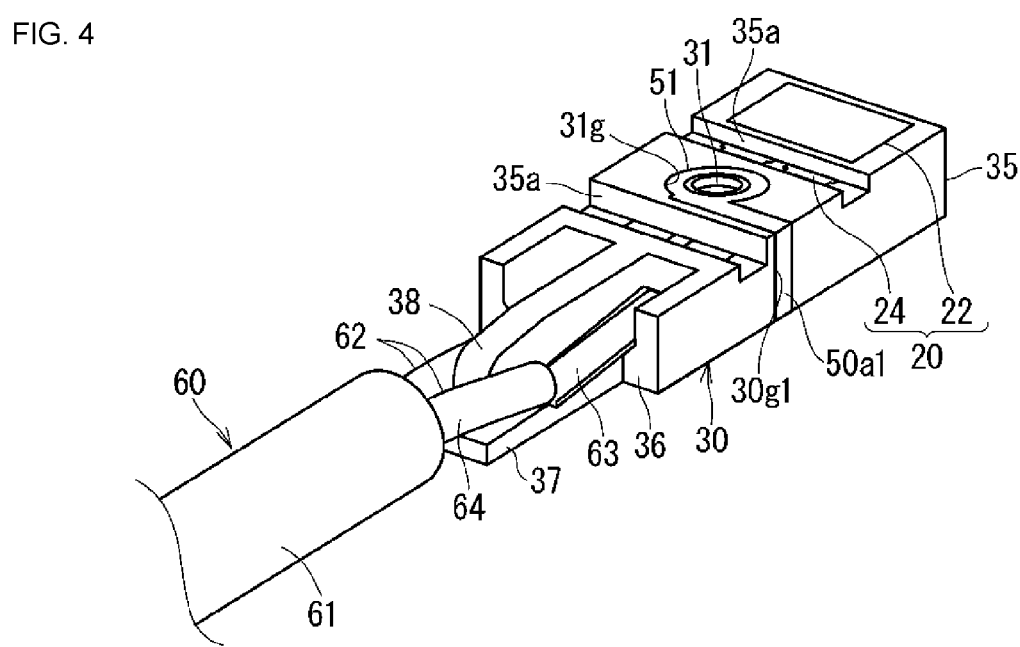
FIG. 4 is a perspective view depicting an inner molded portion and a ring-shaped seal portion.
Figure 5:
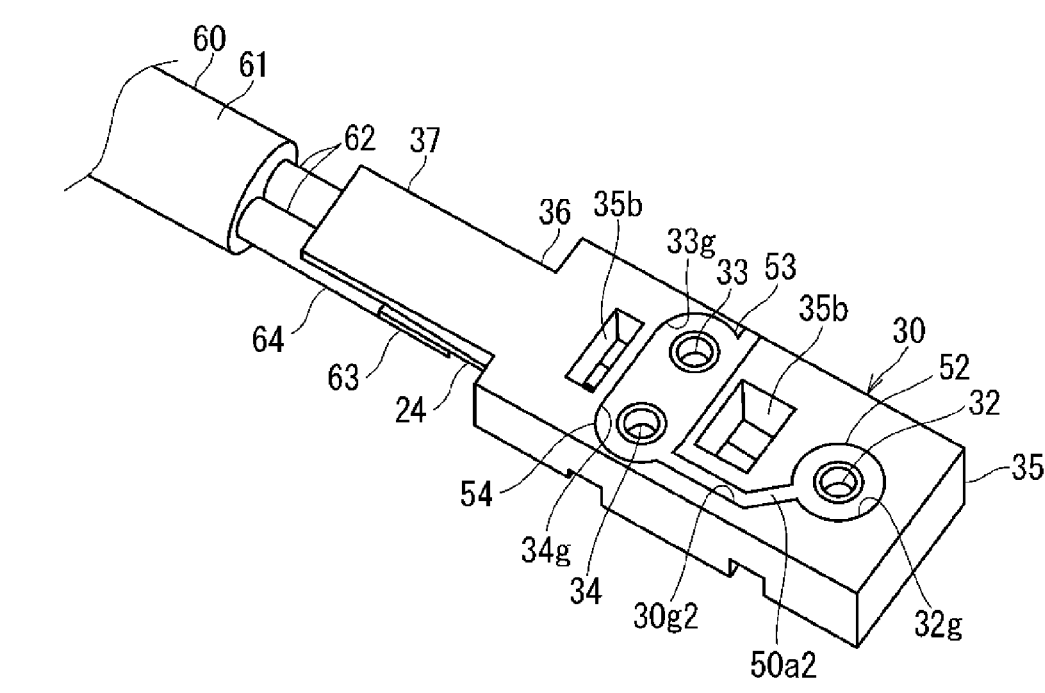
FIG. 5 is a perspective view depicting the inner molded portion and ring-shaped seal portions.
Figure 6:
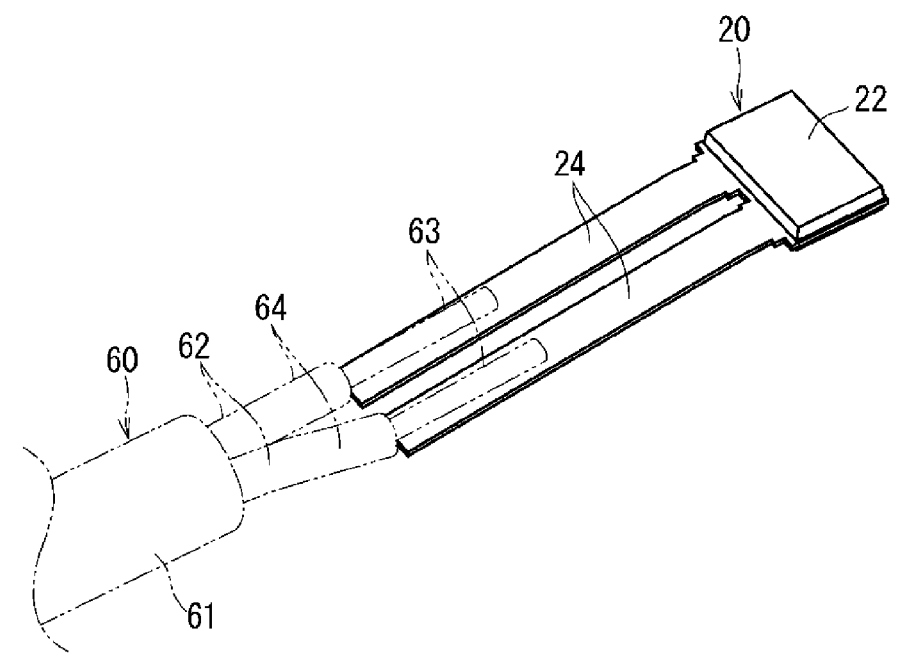
FIG. 6 is a perspective view depicting an internal component.

A composite molded component according to an embodiment will now be described. FIG. 1 and FIG. 2 are perspective views depicting a composite molded component 10. FIG. 3 is a cross-sectional view taken along a line III-III in FIG. 1. FIG. 4 and FIG. 5 are perspective views depicting an inner molded portion 30 and ring-shaped seal portions 51, 52, 53, and 54 of the composite molded component. FIG. 1 and FIG. 4 are perspective views from the same direction. FIG. 2 and FIG. 5 are perspective views from the same direction. FIG. 6 is a perspective view depicting an internal component 20.

The composite molded component 10 includes the internal component 20, the inner molded portion 30, an outer molded portion 40, and the ring-shaped seal portions 51, 52, 53, and 54.

The internal component 20 is a component covered by the inner molded portion 30 and the outer molded portion 40. As one example, the internal component 20 is an electronic component, such as a sensor element.

The inner molded portion 30 is a resin part that covers the internal component 20. The outer molded portion 40 is a resin part that covers the internal component 20 and the inner molded portion 30. By covering the internal component 20 with the inner molded portion 30 and further covering this with the outer molded portion 40, improved waterproofing of the internal component 20 is achieved. As one example, the inner molded portion 30 is molded in a state where the internal component 20 has been positioned using positioning pins. After this, it is also possible to mold the outer molded portion 40 in a state where the inner molded portion 30 has been positioned by positioning pins. By doing so, the positional accuracy of the internal component 20 inside the inner molded portion 30 and the outer molded portion 40 is improved and the entire internal component 20 is covered with the inner molded portion 30 and the outer molded portion 40, which can improve waterproofing.

The ring-shaped seal portions 51, 52, 53, and 54 form a waterproof seal between the inner molded portion 30 and the outer molded portion 40, which improves the waterproofing of the internal component 20. In particular, by surrounding holes 41, 42, 43, and 44, which are marks made on the inner molded portion 30 by positioning pins during molding of the outer molded portion 40, with the ring-shaped seal portions 51, 52, 53, and 54, waterproofing of the internal component 20 is improved.

In more detail, the internal component 20 is a sensor element 20, for example. The sensor element 20 is an element that detects a physical quantity, such as magnetism, light, or temperature, and/or changes in such quantity. Here, a case where the sensor element 20 is assumed to be a magnetic sensor will be described. Magnetic fields are hardly affected by resin, which is a non-magnetic material. This means that when the sensor element 20 is a magnetic sensor, the entire sensor element 20 may be covered by the inner molded portion 30 and the outer molded portion 40.

The sensor element 20 is equipped with an element main body portion 22 and lead portions 24. As one example, the element main body portion 22 is formed in a flat rectangular parallelepiped shape. The element main body portion 22 outputs a signal in keeping with the peripheral environment, as examples, the size, orientation, and the like of a peripheral magnetic field. The lead portions 24 extend from the element main body portion 22. In this example, two lead portions 24 extend from the element main body portion 22 in parallel. In this example, the lead portions 24 are formed of metal or the like in the shape of narrow plates. A detection output of the element main body portion 22 is outputted to the outside via the two lead portions 24.

The output of the sensor element 20 is transmitted via a cable 60. The cable 60 includes a plurality of (in this example, two) electric wires 62 and an outer covering 61. The electric wires 62 are typical covered electric wires and each have a covering 64 formed around a core wire 63. The outer covering 61 covers the two electric wires 62. The outer covering 61 is stripped at end portions of the cable 60 to expose the two electric wires 62. The covering 64 is stripped at end portions of the two electric wires 62 to expose the core wires 63. The end portions of the two electric wires 62 are disposed on and along the two lead portions 24, and the respective core wires 63 are electrically and mechanically connected to the lead portions 24. In this example, the core wires 63 are soldered to the lead portions 24. The core wires 63 and the lead portions 24 may be electrically and mechanically connected by welding, crimping, or the like.

It is not essential for the electric wires to be connected to the sensor element 20 to be gathered into a single element using an outer covering or the like. The electric wires connected to the sensor element may extend away from the sensor element individually. The number of electric wires connected to the sensor element may be increased or decreased depending on factors such as the number of lead portions of the sensor element. It is not essential for electric wires to be connected to the sensor element, and another FPC (flexible printed circuit) or the like may be connected to a sensor.

The inner molded portion 30 is a part formed using resin. As examples, the inner molded portion 30 may be formed of polyamide resin, PE (polyethylene), PBT (polybutylene terephthalate), or the like. The inner molded portion 30 is a part that covers the sensor element 20.

In more detail, the inner molded portion 30 is a part produced by molding resin with the sensor element 20 as an insert component. The inner molded portion 30 is provided with an element housing portion 35 and a lead portion housing portion 36.

The element housing portion 35 is formed in a rectangular parallelepiped shape. The element main body portion 22 of the sensor element 20 is housed at a position close to a first main surface of a first end portion of the element housing portion 35. The lead portions 24 that extend away from the element main body portion 22 pass inside the element housing portion 35 and extend toward a second end of the element housing portion 35.

The lead portion housing portion 36 is provided so as to connect to the second end portion of the element housing portion 35. The lead portion housing portion 36 includes a bottom plate portion 37 and a partition portion 38. The bottom plate portion 37 is formed as a plate that extends from the second end portion of the element housing portion 35. The two lead portions 24 extend onto the bottom plate portion 37. The partition portion 38 is provided at a center portion in a width direction of the bottom plate portion 37 as a partition between the two lead portions 24.

A first main surface of the element main body portion 22 is exposed at the first main surface of the first end portion of the element housing portion 35. At least one (here, two) recessed portions 35a are formed in the first main surface of the element housing portion 35. At least one (here, two) recessed portions 35b are formed in a second main surface of the element housing portion 35. The two lead portions 24 are exposed via the recessed portions 35a and 35b on both main surface sides of the element housing portion 35.

When the inner molded portion 30 is molded with the sensor element 20 as an insert component, the respective exposed parts described above of the sensor element 20 are placed in contact with a mold surface and/or positioning parts of a mold device. By doing so, the inner molded portion 30 is molded in a state where the sensor element 20 has been positioned inside the mold device. This means that the sensor element 20 is precisely held at a fixed position with respect to the inner molded portion 30.

Note that the core wires 63 described above may be soldered to the lead portions 24 in a state where the sensor element 20 has been inserted in the inner molded portion 30. However, the core wires 63 may be soldered to the lead portions 24 before the sensor element 20 is inserted into the inner molded portion 30. It is not essential for the inner molded portion 30 to be molded with the sensor element 20 as an insert component. It is also possible to mold the inner molded portion 30 into a shape into which the sensor element 20 can be fitted and to then fit the sensor element 20 into the inner molded portion 30.

The outer molded portion 40 is a part formed using resin. As examples, the outer molded portion 40 may be formed of polyamide resin, PE (polyethylene), PBT (polybutylene terephthalate), or the like in the same way as the inner molded portion 30. It is not essential for the outer molded portion 40 and the inner molded portion 30 to be the same and formed of resin. If the outer molded portion 40 and the inner molded portion 30 are the same and formed of resin, favorable adhesion is achieved between the two.

The outer molded portion 40 covers the inner molded portion 30. The outer molded portion 40 may cover the entire periphery of the inner molded portion 30, or may cover part of the inner molded portion 30. In this example, the outer molded portion 40 covers the entire inner molded portion 30 except for parts of the inner molded portion 30 used for positioning. That is, the entire periphery of the sensor element 20 is covered by at least one of the inner molded portion 30 and the outer molded portion 40. Here, the outer form of the outer molded portion 40 is formed in a narrow rectangular parallelepiped shape. The element main body portion 22 is embedded in a part that is close to a first end portion of the outer molded portion 40. A front end portion of the outer covering 61 of the cable 60 is embedded in a part close to a second end portion of the outer molded portion 40. The part of the cable 60 that is covered by the outer covering 61 extends outward from the second end portion of the outer molded portion 40. Note that it is not essential for the outer form of the outer molded portion 40 to be a rectangular parallelepiped.

The holes 41, 42, 43, and 44 are formed in the outer molded portion 40 and reach the inner molded portion 30 from surfaces of the outer molded portion 40. In this example, the hole 41 is formed at a position near the first end portion on a first main surface of the outer molded portion 40 (see FIG. 1). The hole 41 reaches an intermediate portion in a length direction of the first main surface of the inner molded portion 30. The hole 42 is formed at a position near the first end portion on a second main surface of the outer molded portion 40 (see FIG. 2). The hole 42 reaches a part near a second end portion on a second main surface of the inner molded portion 30. The pair of holes 43 and 44 are formed in an intermediate portion in the length direction on the second main surface of the outer molded portion 40 (see FIG. 2). The holes 43 and 44 reach intermediate portions in the length direction on the second main surface of the inner molded portion 30. Here, positioning recessed portions 31, 32, 33, and 34, which are continuous with the holes 41, 42, 43, and 44, are formed in the surfaces of the inner molded portion 30 at positions corresponding to the holes 41, 42, 43, and 44.

When the outer molded portion 40 is molded with the sensor element 20 and the inner molded portion 30 as inserts, a state is produced where positioning pins pass locations corresponding to the holes 41, 42, 43, and 44 and are placed in contact with the surfaces of the inner molded portion 30. In this example, the positioning pins pass through the holes 41, 42, 43, and 44 and are inserted into positioning recessed portions 31, 32, 33, and 34 to position the inner molded portion 30. By doing so, the outer molded portion 40 is molded in a state where the inner molded portion 30 is positioned inside the mold device. This means the inner molded portion 30 is accurately held at a fixed position with respect to the outer molded portion 40. The sensor element 20 held by the inner molded portion 30 is also accurately held at a fixed position with respect to the outer molded portion 40. Note that the holes 41, 42, 43, and 44 and the positioning recessed portions 31, 32, 33, and 34 are formed in circular shapes. The holes 41, 42, 43, and 44 and the positioning recessed portions 31, 32, 33, and 34 may be other shapes, such as elliptical or polygonal.

The ring-shaped seal portions 51, 52, 53, and 54 that surround the holes 41, 42, 43, and 44 are formed between the inner molded portion 30 and the outer molded portion 40. Inside the holes 41, 42, 43, and 44 described above, the boundaries between the inner molded portion 30 and the outer molded portion 40 may be exposed. The ring-shaped seal portions 51, 52, 53, and 54 can surround these exposed parts.

The ring-shaped seal portion 51 covers the circumference of the hole 41, the ring-shaped seal portion 52 covers the circumference of the hole 42, the ring-shaped seal portion 53 covers the circumference of the hole 43, and the ring-shaped seal portion 54 covers the circumference of the hole 44. In this example, the ring-shaped seal portions 51, 52, 53, and 54 surround the holes 41, 42, 43, and 44 indirectly with gaps in between. However, the ring-shaped seal portions 51, 52, 53, and 54 may directly surround the holes 41, 42, 43, and 44 with no gaps.

Inner circumferential edges and outer circumferential edges of the ring-shaped seal portions 51, 52, 53, and 54 have any shapes. In this example, the inner circumferential edges of the ring-shaped seal portions 51, 52, 53, and 54 are formed in circular shapes. The outer circumferential edges of the ring-shaped seal portions 51 and 52 are also formed in circular shapes. The ring-shaped seal portions 53 and 54 are continuous as an integral body, and the outer peripheral edge of the integrated ring-shaped seal portions 53 and 54 traces an oval shape. Inside the holes 41, 42, 43, and 44, boundaries between the inner molded portion 30 and the outer molded portion 40 may be exposed. It is possible for the ring-shaped seal portions 51, 52, 53, and 54 to surround these exposed parts.

The ring-shaped seal portions 51, 52, 53, and 54 are formed of a softer material than the inner molded portion 30. "Softness" referred to here may be evaluated according to a material's ability to stretch and contract, and as one example may be evaluated according to Rockwell hardness (JIS Z 2245). As one example, the inner molded portion 30 may be formed of polyamide resin, PE (polyethylene), PBT (polybutylene terephthalate), or the like, and the ring-shaped seal portions 51, 52, 53, and 54 may be formed of an elastic material, such as urethane resin or synthetic rubber, which is softer. The outer molded portion 40 may be made of the same material as the inner molded portion 30, or may be made of a different material. One specific example is a configuration where the inner molded portion 30 and the outer molded portion 40 are formed of polyamide resin, such as nylon, and the ring-shaped sealing portions 51, 52, 53, and 54 are formed of a thermoplastic urethane resin.

The ring-shaped seal portions 51, 52, 53, and 54 may be embedded in surfaces of the inner molded portion 30, may be embedded in inner surfaces of the outer molded portion 40, or may be embedded in both the inner molded portion 30 and the outer molded portion 40. In the present embodiment, ring-shaped channels 31g, 32g, 33g, and 34g that surround the holes 41, 42, 43, and 44 are formed in the surface of the inner molded portion 30. The ring-shaped channel 31g is formed in a region corresponding to the ring-shaped seal portion 51, the ring-shaped channel 32g is formed in a region corresponding to the ring-shaped seal portion 52, and the ring-shaped channels 33g and 34g are formed in regions corresponding to the ring-shaped seal portions 53 and 54. The ring-shaped channels 31g, 32g, 33g, and 34g are formed to a depth that does not reach the sensor element 20.

The ring-shaped seal portions 51, 52, 53, and 54 are provided so as to fill the ring-shaped channels 31g, 32g, 33g, and 34g. FIG. 3 to FIG. 5 depict how outward surfaces of the ring-shaped seal portions 51, 52, 53, and 54 are flush (continuous) with the inner molded portion 30. However, the ring-shaped seal portions 51, 52, 53, and 54 may be recessed or protrude from outer surfaces of the inner molded portion 30.

Figure 7:
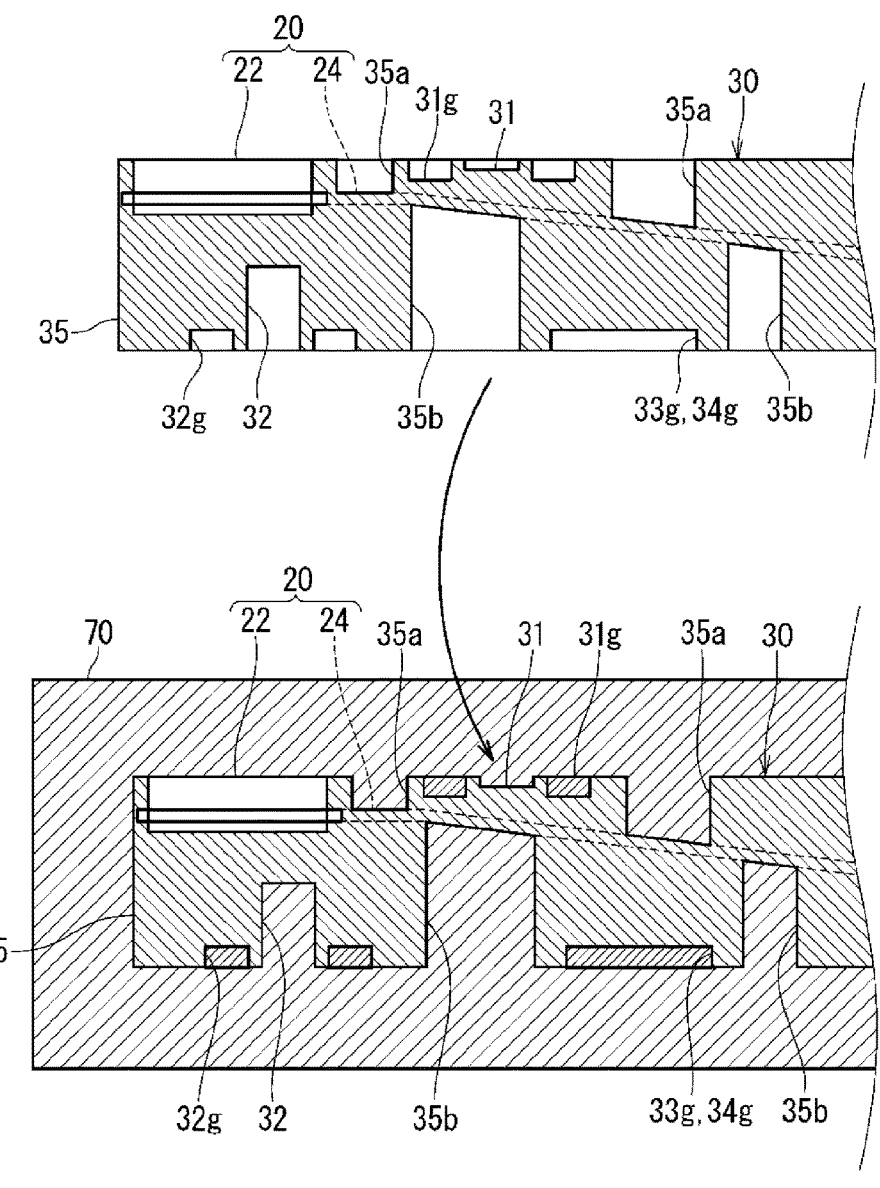
FIG. 7 is a diagram useful in explaining an example process that molds ring-shaped seal portions on an inner molded portion.

The inner molded portion 30 and the ring-shaped seal portions 51, 52, 53, and 54 described above may be formed by double molding (which includes a method referred to as "two-color molding") or insert molding with the inner molded portion 30 as a primary molded portion and the ring-shaped seal portions 51, 52, 53, and 54 as secondary molded portions. As one example, as depicted in FIG. 7, an inner molded portion 30 that holds the sensor element 20 is prepared. The ring-shaped channels 31g, 32g, 33g, and 34g are formed in this inner molded portion 30. The inner molded portion 30 holding the sensor element 20 is set inside a mold 70 for molding the ring-shaped seal portions 51, 52, 53, and 54. In this state, molten material for molding the ring-shaped seal portions 51, 52, 53, and 54 is poured into the ring-shaped channels 31g, 32g, 33g, and 34g. By solidifying the molten material inside the ring-shaped channels 31g, 32g, 33g, and 34g, the ring-shaped seal portions 51, 52, 53, and 54 are molded.

The plurality of ring-shaped channels 31g, 32g, 33g, and 34g are joined by connecting channels 30g1 and 30g2 so that the molten material can be easily poured into the plurality of ring-shaped channels 31g, 32g, 33g, and 34g formed in the inner molded portion 30. In this example, the ring-shaped channel 31g on the first main surface of the inner molded portion 30 and the ring-shaped channels 33g and 34g on the second main surface are connected by the connecting channel 30g1 via one side of the inner molded portion 30 (see FIG. 4). The ring-shaped channel 32g on the second main surface of the inner molded portion 30 and the ring-shaped channels 33g and 34g are connected by the connecting channel 30g2 provided on the second main surface of the inner molded portion 30 (see FIG. 5). This means that inside the mold 70, when molten material is poured into any of the ring-shaped channels 31g, 32g, 33g, and 34g and the connecting channels 30g1 and 30g2, the molten material can easily flow into the plurality of ring-shaped channels 31g, 32g, 33g, and 34g. In the configuration described here, a connecting portion 50a1 is formed in a part of the surface of the inner molded portion 30 where the connecting channel 30g1 is formed and a connecting portion 50a2 is formed in a part where the connecting channel 30g2 is formed. The connecting portions 50a1 and 50a2 are made of the same material as the ring-shaped seal portions 51, 52, 53 and 54, the connecting portion 50a1 connects the ring-shaped seal portion 51 and the ring-shaped seal portions 53 and 54, and the connecting portion 50a2 connects the ring-shaped seal portion 52 and the ring-shaped seal portions 53 and 54.

Note that when the inner molded portion 30 and the ring-shaped seal portions 51, 52, 53, and 54 are formed by double molding, out of the surfaces of the inner molded portion 30, other surfaces where the ring-shaped channels 31g, 32g, 33g, and 34g and the connecting channels 30g1 and 30g2 described above are not formed may be formed by the same mold.

Figure 8:
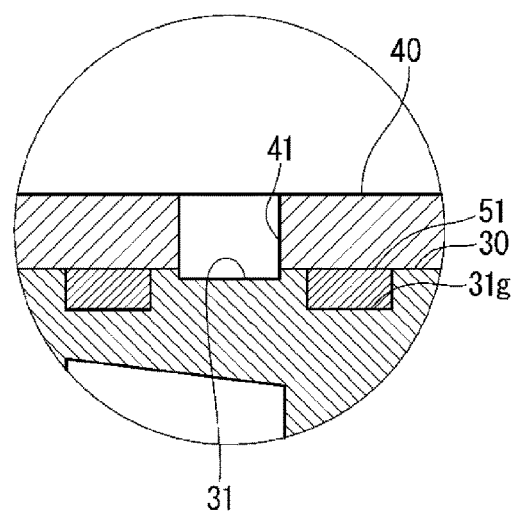
FIG. 8 is an enlarged view of part of FIG. 3.

When the outer molded portion 40 is molded with the inner molded portion 30 and the ring-shaped seal portions 51, 52, 53, and 54 that have been formed as described above as inserts, as depicted in FIGS. 3 and 8, the ring-shaped seal portions 51, 52, 53, and 54 become positioned between the inner molded portion 30 and the outer molded portion 40 at parts that surround the holes 41, 42, 43, and 44. As one example, it would be conceivable, during molding of the outer molded portion 40, for the ring-shaped seal portions 51, 52, 53, and 54 to soften due to heat and become compressed so that the ring-shaped seal portions 51, 52, 53, and 54 tightly adhere to and fill the spaces between the inner molded portion 30 and the outer molded portion 40. By doing so, parts that surround the holes 41, 42, 43, and 44 between the inner molded portion 30 and the outer molded portion 40 become favorably sealed by the ring-shaped seal portions 51, 52, 53, and 54. Note that since the inner molded portion 30 is formed of a hard resin such as polyamide resin, the inner molded portion 30 is unlikely to deform during molding of the outer molded portion 40, which means that the sensor element 20 is held at a fixed position inside the inner molded portion 30. Even if the inner molded portion

30 and the outer molded portion 40 contract or expand during cooling of the outer molded portion 40, during usage after cooling, or the like, the ring-shaped seal portions 51, 52, 53, and 54 interposed between the inner molded portion 30 and the outer molded portion 40 can easily deform in keeping with such contraction or expansion, which means the sealing between the inner molded portion 30 and the outer molded portion 40 can be maintained. As a result, favorable sealing of the parts surrounding the holes 41, 42, 43, and 44 between the inner molded portion 30 and the outer molded portion 40 is maintained.

According to the composite molded component configured as described above, even if deformation of at least one of the inner molded portion 30 and the outer molded portion 40 occurs due to thermal shrinkage, thermal expansion, or the like, the ring-shaped seal portions 51, 52, 53, and 54 themselves are capable of deforming in keeping with such deformation. By doing so, sealing of the parts that surround the holes between the inner molded portion 30 and the outer molded portion 40 is maintained by the ring-shaped seal portions 51, 52, 53, and 54. As a result, the performance of the seal between the inner molded portion 30 and the outer molded portion 40 is further improved. Since the ring-shaped seal portions 51, 52, 53, and 54 are provided at parts that surround the holes 41, 42, 43, and 44 and not the entire inner molded portion 30 and outer molded portion 40, it is possible to maintain the required strength for the composite molded component 10.

By forming the inner molded portion 30 and the outer molded portion 40 described above of polyamide resin, the composite molded component 10 can be provided with strength. Also, by forming the ring-shaped seal portions 51, 52, 53, and 54 of urethane resin, the performance of the seal around the holes 41, 42, 43, and 44 between the inner molded portion 30 and the outer molded portion 40 is improved.

Since the ring-shaped seal portions 51, 52, 53, and 54 are provided so as to fill the ring-shaped channels 31g, 32g, 33g, and 34g of the inner molded portion 30, the ring-shaped seal portions 51, 52, 53, and 54 are likely to remain in place surrounding the holes 41, 42, 43, and 44 when the outer molded portion 40 is formed. By doing so, favorable sealing can be achieved.

In addition, if the inner molded portion 30 and the ring-shaped seal portions 51, 52, 53, and 54 are formed by double molding or insert molding, adhesion between the inner molded portion 30 and the ring-shaped seal portions 51, 52, 53, and 54 is enhanced, which further improves the seal.

In this case, when the plurality of ring-shaped seal portions 51, 52, 53, and 54 are connected by the connecting portions 50a1 and 50a2, it becomes easy to form the plurality of ring-shaped seal portions 51, 52, 53, and 54 in a state where the ring-shaped seal portions 51, 52, 53, and 54 are connected by the connecting portions 50a1 and 50a2.

Figure 9:
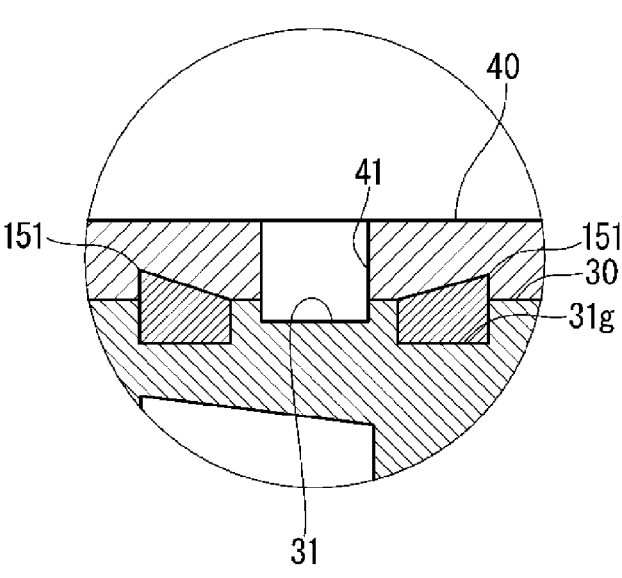
FIG. 9 is a cross-sectional view depicting a ring-shaped seal portion according to a modification.

Note that like a modification depicted in FIG. 9, a ring-shaped seal portion 151, which corresponds to the ring-shaped seal portion 51, may protrude from the inner molded portion 30. The ring-shaped seal portion 151 may be shaped so that the width gradually narrows toward a front end. This facilitates deformation by heat of the front end portion of the ring-shaped seal portion 151 when the outer molded portion 40 is molded. As a result, it is easy to maintain a state where the front end portion of the ring-shaped seal portion 151 tightly adheres to the outer molded portion 40.

Note that the configurations described in the above embodiment and modification can be combined as appropriate so long as there is no conflict between them.

Experimental Example

A composite molded component 10, in which the inner molded portion 30 and the outer molded portion 40 are formed of nylon and the ring-shaped seal portions 51, 52, 53, and 54 are formed of urethane resin, was actually manufactured and it was confirmed that favorable sealing can be achieved.

The invention claimed is:

1. A composite molded component comprising:
an internal component;
an inner molded portion formed of a resin molded material, the inner molded portion covering the internal component; and
an outer molded portion formed of a resin molded material, the outer molded portion covering both the inner molded portion and the internal component,
wherein a hole that reaches the inner molded portion is formed in the outer molded portion, a ring-shaped seal portion that surrounds the hole is provided between the inner molded portion and the outer molded portion, and
the ring-shaped seal portion is formed of a softer material than the resin molded material of the inner molded portion.

2. The composite molded component according to claim 1, wherein the inner molded portion and the outer molded portion are formed of polyamide resin, and
the ring-shaped seal portion is formed of urethane resin.

3. The composite molded component according to claim 1, wherein a ring-shaped channel that surrounds the hole is formed in a surface of the inner molded portion, and
the ring-shaped seal portion is provided to fill the ring-shaped channel.

4. The composite molded component according to claim 1, wherein the inner molded portion and the ring-shaped seal portion are formed by double molding or insert molding with the inner molded portion as a primary molded portion and the ring-shaped seal portion as a secondary molded portion.

5. The composite molded component according to claim 1, wherein a plurality of the ring-shaped seal portions are formed, and
a connecting portion formed of a same material as the ring-shaped seal portions is provided so as to connect the plurality of ring-shaped seal portions.

6. The composite molded component according to claim 1, wherein the ring-shaped seal portion protrudes from the inner molded portion.

7. The composite molded component according to claim 2, wherein a ring-shaped channel that surrounds the hole is formed in a surface of the inner molded portion, and
the ring-shaped seal portion is provided to fill the ring-shaped channel.

8. The composite molded component according to claim 2, wherein the inner molded portion and the ring-shaped seal portion are formed by double molding or insert molding with the inner molded portion as a primary molded portion and the ring-shaped seal portion as a secondary molded portion.

9. The composite molded component according to claim 3, wherein the inner molded portion and the ring-shaped seal portion are formed by double molding or insert molding with the inner molded portion as a primary molded portion and the ring-shaped seal portion as a secondary molded portion.

10. The composite molded component according to claim 2, wherein a plurality of the ring-shaped seal portions are formed, and a connecting portion formed of a same material as the ring-shaped seal portions is provided so as to connect the plurality of ring-shaped seal portions.

11. The composite molded component according to claim 3, wherein a plurality of the ring-shaped seal portions are formed, and a connecting portion formed of a same material as the ring-shaped seal portions is provided so as to connect the plurality of ring-shaped seal portions.

12. The composite molded component according to claim 4, wherein a plurality of the ring-shaped seal portions are formed, and a connecting portion formed of a same material as the ring-shaped seal portions is provided so as to connect the plurality of ring-shaped seal portions.

13. The composite molded component according to claim 2, wherein the ring-shaped seal portion protrudes from the inner molded portion.

14. The composite molded component according to claim 3, wherein the ring-shaped seal portion protrudes from the inner molded portion.

15. The composite molded component according to claim 4, wherein the ring-shaped seal portion protrudes from the inner molded portion.

16. The composite molded component according to claim 5, wherein each ring-shaped seal portion protrudes from the inner molded portion.

* * * * *